(12) United States Patent
Jeong et al.

(10) Patent No.: US 10,103,651 B2
(45) Date of Patent: Oct. 16, 2018

(54) PIEZOELECTRIC ENERGY HARVESTER AND WIRELESS SWITCH INCLUDING THE SAME

(71) Applicant: SAMSUNG ELECTRO-MECHANICS CO., LTD., Suwon-si (KR)

(72) Inventors: In Wha Jeong, Suwon-si (KR); Jong Heum Park, Suwon-si (KR); Hugh Kim, Suwon-si (KR)

(73) Assignee: Samsung Electo-Mechanics Co., Ltd., Suwon-si (KR)

( * ) Notice: Subject to any disclaimer, the term of this patent is extended or adjusted under 35 U.S.C. 154(b) by 339 days.

(21) Appl. No.: 14/842,147

(22) Filed: Sep. 1, 2015

(65) Prior Publication Data

US 2016/0065094 A1 Mar. 3, 2016

(30) Foreign Application Priority Data

Sep. 1, 2014 (KR) .................. 10-2014-0115721
Apr. 22, 2015 (KR) .................. 10-2015-0056709

(51) Int. Cl.
*H02N 2/18* (2006.01)
*H01H 13/705* (2006.01)
*H01L 41/113* (2006.01)

(52) U.S. Cl.
CPC ............ *H02N 2/18* (2013.01); *H01H 13/705* (2013.01); *H01H 2201/02* (2013.01);
(Continued)

(58) Field of Classification Search
CPC .............................. H01L 41/113; H02N 2/18
(Continued)

(56) References Cited

U.S. PATENT DOCUMENTS 3,339,104 A * 8/1967 Kushner .............. H03K 17/78
310/319
4,032,804 A * 6/1977 Wagner .................. G01P 1/003
200/181

(Continued)

FOREIGN PATENT DOCUMENTS

CN 200990348 Y 12/2007
CN 203700986 U 7/2014

(Continued)

OTHER PUBLICATIONS

Chinese Office Action dated Aug. 15, 2017 in corresponding Chinese Patent Application No. 201510552634.2 (11 pages in English and 8 pages in Korean).

(Continued)

*Primary Examiner* — J. San Martin
(74) *Attorney, Agent, or Firm* — NSIP Law

(57) ABSTRACT

Examples provide a piezoelectric energy harvester and a wireless switch including the same. The piezoelectric energy harvester includes a pressure transmission part situated between a pressing plate and a piezoelectric body, so as to transmit a uniform amount of pressure to the piezoelectric body, thereby generating a constant level of energy. In addition, a wireless switch uses energy generated in the piezoelectric energy harvester as its driving power, thereby transmitting radio frequency (RF) communications signals to an external electronic device to control the operation of the electronic device.

18 Claims, 2 Drawing Sheets

(52) U.S. Cl.
CPC . *H01H 2221/038* (2013.01); *H01H 2221/064* (2013.01); *H01H 2239/076* (2013.01); *H01H 2300/03* (2013.01); *H01L 41/1138* (2013.01)

(58) Field of Classification Search
USPC .......................................... 200/181; 310/339
See application file for complete search history.

(56) References Cited

U.S. PATENT DOCUMENTS

| | | | | |
|---|---|---|---|---|
| 4,158,117 | A * | 6/1979 | Quilliam | G01L 1/16 200/181 |
| 4,761,582 | A * | 8/1988 | McKee | G10K 9/122 310/317 |
| 5,155,408 | A * | 10/1992 | Takeuchi | H01L 41/113 310/328 |
| 5,231,326 | A * | 7/1993 | Echols | B66B 1/462 310/319 |
| 5,499,041 | A * | 3/1996 | Brandenburg | G05G 9/047 200/5 R |
| 5,988,646 | A * | 11/1999 | Fair | A63B 63/00 273/371 |
| 7,250,708 | B2 * | 7/2007 | Stadelmann | H01H 9/16 200/181 |
| 7,256,670 | B2 * | 8/2007 | Jahnes | H01H 59/0009 200/181 |
| 2011/0140578 | A1 | 6/2011 | Ko et al. | |
| 2013/0068032 | A1 * | 3/2013 | Nikolovski | H01L 41/1132 73/778 |
| 2013/0169114 | A1 | 7/2013 | Kim | |
| 2013/0249349 | A1 * | 9/2013 | Matter | H01L 41/1138 310/330 |
| 2018/0088720 | A1 * | 3/2018 | Wang | G06F 3/0414 |

FOREIGN PATENT DOCUMENTS

| | | |
|---|---|---|
| JP | 3687385 B2 | 6/2005 |
| JP | 2011-97687 A | 5/2011 |
| JP | 2014-36500 A | 2/2014 |
| KR | 10-2010-0049771 A | 5/2010 |
| KR | 10-2011-0052399 A | 5/2011 |
| KR | 10-2011-0110444 A | 10/2011 |
| KR | 10-1295670 B1 | 8/2013 |

OTHER PUBLICATIONS

Chinese Office Action dated Jan. 17, 2017 in counterpart Chinese Patent Application No. 201510552634.2 (19 pages, with English translation).

Korean Office Action dated Nov. 18, 2016 in counterpart Korean Patent Application No. 10-2015-0056709 (10 pages, with English translation).

Korean Office Action dated Jul. 21, 2016 in counterpart Korean Patent Application No. 10-2015-0056709 (8 pages, with English translation).

\* cited by examiner

PIEZOELECTRIC ENERGY HARVESTER AND WIRELESS SWITCH INCLUDING THE SAME

CROSS-REFERENCE TO RELATED APPLICATION(S)

This application claims the benefit under 35 USC 119(a) of Korean Patent Application Nos. 10-2014-0115721 filed on Sep. 1, 2014 and 10-2015-0056709 filed on Apr. 22, 2015, in the Korean Intellectual Property Office, the entire disclosures of which are incorporated herein by reference for all purposes.

BACKGROUND

1. Field

The following description relates to a piezoelectric energy harvester and a wireless switch including the same.

2. Description of Related Art

Generally, a lighting device is turned on or off by using a switch. Since such a switch needs to be disposed in a position reachable by a user, the switch is generally positioned on the surface of a wall within a building. Therefore, a power line controlled by the switch is formed inside of the wall of the building.

When the user turns such a lighting device on or off, the user moves to be directly proximate to a wall on which the switch is formed and manually manipulates the switch to turn the lighting device on or off. However, this scheme is somewhat inconvenient in terms of the need for direct manual manipulation of the switch by the user. Hence, it may be difficult for a user to identify his or her surroundings after the lighting device is turned off at night, causing inconvenience in manipulation of the switch.

Therefore, a wireless switch device is useful in order to address the inconvenience of manual manipulation as described above and to allow for improved user convenience in turning lighting devices on and off.

When a user manipulates a transmitting unit of a remote control device, or the like, which acts as a wireless switch device, a lighting device control signal is wirelessly transmitted from the remote control device, and a receiving unit provided in the wall receives the wireless signal from the remote control device to turn the lighting device on or off.

Since a battery, or a similar source of electrical energy, is embedded in the transmitting unit of the remote control device, the battery needs to be periodically replaced, which is inconvenient for the user.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide a piezoelectric energy harvester capable of providing driving power to a transmitting module included in a wireless switch, and a wireless switch including the same.

Examples also provide a piezoelectric energy harvester in which a uniform amount of pressure is transmitted to a piezoelectric element included in the piezoelectric energy harvester, and a wireless switch including the same.

According to an example, a piezoelectric energy harvester includes a pressure transmission part disposed between a pressing plate and a piezoelectric body to transmit a uniform amount of pressure to the piezoelectric body, thereby generating a constant level of energy.

In addition, according to another aspect of the present disclosure, a wireless switch uses energy generated in the piezoelectric energy harvester as driving power, thereby transmitting radio frequency (RF) communications signals to an external electronic device.

In one general aspect, a piezoelectric energy harvester includes a plate, a piezoelectric element situated on one surface of the plate, a pressing plate situated so as to be spaced apart from the piezoelectric element, and a pressure transmission element situated between the pressing plate and the piezoelectric element.

The pressing plate may have a through-hole penetrating through the pressing plate, one end of the pressure transmission element may be inserted into the through-hole, and the other end of the pressure transmission element may be situated to be in contact with the piezoelectric element.

The pressure transmission element may include a body including upper and lower portions that are open, and that including an internal space, a first elastic member enclosing the upper portion of the body, and a second elastic member enclosing the lower portion of the body.

The upper portion of the body and the lower portion of the body may have different areas.

The body may have a conical shape.

The internal space of the body may be filled with a fluid.

The fluid may be an incompressible fluid.

The internal space of the body may be filled with a solid that conveys elastic force.

The first elastic member may be inserted into a through-hole penetrating through the pressing plate, and the second elastic member may be in contact with the piezoelectric element.

The first elastic member and the second elastic member may have different areas.

An area of the first elastic member may be larger than that of the second elastic member.

In response to a force being applied to the first elastic member, an amount of pressure acting on the first elastic member may be smaller than an amount of pressure acting on the second elastic member.

In another general aspect, a wireless switch includes a piezoelectric energy harvester including a plate, a piezoelectric element situated on one surface of the plate, a pressing plate situated so as to be spaced apart from the piezoelectric element, and a pressure transmission element situated between the pressing plate and the piezoelectric element, and a transmitting module that transmits electrical signals using power generated by the piezoelectric energy harvester as driving power.

The pressing plate may have a through-hole penetrating through the pressing plate, one end of the pressure transmission element may be inserted into the through-hole, and the other end of the pressure transmission element may be situated to be in contact with the piezoelectric element.

The pressure transmission element may include a body comprising upper and lower portions that are open, and that includes an internal space, a first elastic member enclosing the upper portion of the body, and a second elastic member enclosing the lower portion of the body.

The upper portion of the body and the lower portion of the body may have different areas.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
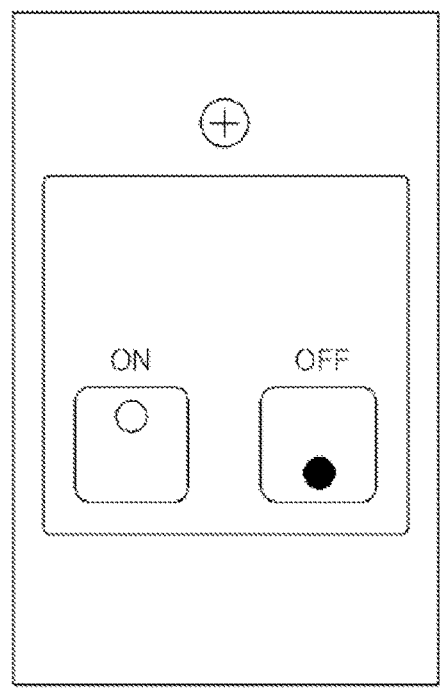
FIG. 1 is a plan view of a wireless switch according to an example.
Figure 2:
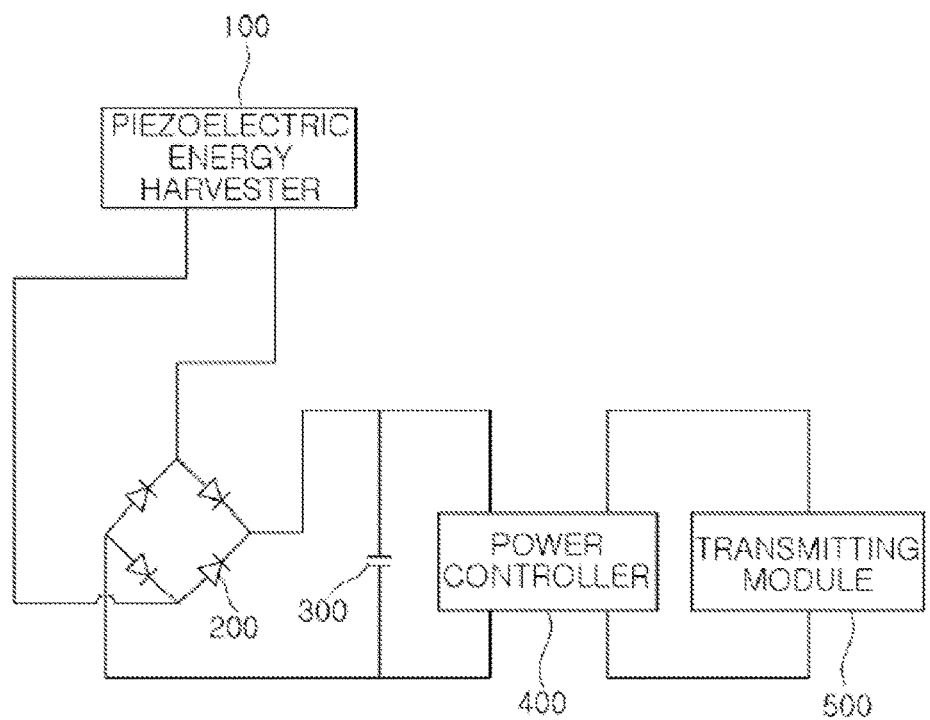
FIG. 2 is a schematic view of the wireless switch according to an example.

FIG. 1 is a plan view of a wireless switch according to an example, and FIG. 2 is a schematic view of the wireless switch according to an example.

Referring to FIGS. 1 and 2, the wireless switch according to an example includes a piezoelectric energy harvester 100, a rectifier 200, a capacitor 300, a power controller 400, and a transmitting module 500.

The wireless switch, according to an example, uses power generated in the piezoelectric energy harvester 100 as driving power to toggle the switch.

For example, the wireless switch is to be provided in a location in which the wireless switch is easily manipulated by a user.

As an example, the wireless switch is installed on a wall surface, or the like. The wireless switch transmits control signals for controlling a device disposed remotely from the wireless switch itself using the transmitting module 500.

As an example, the wireless switch transmits different wireless signals depending on a switching operation of the user to control turning a lighting device disposed on the ceiling on and off. However, this is only one example, and the location of a lighting device is not limited to being disposed on the ceiling.

However, the device controlled by the wireless switch and disposed remotely from the wireless switch is not limited to being a lighting device. For example, the controlled device is an air conditioner, an audio device, or the like, disposed on the ceiling. However, these are only examples, and the controlled device is potentially any device which a user would like to activate and deactivate remotely.

For example, ON and OFF buttons as illustrated in FIG. 1 are provided in a structure in which they are be pressed by a user to generate power in the piezoelectric energy harvester 100. Here, a piezoelectric energy harvester 100 is a device that uses the piezoelectric effect to generate an electrical charge by convert a force by the user into an electric charge.

Figure 3:
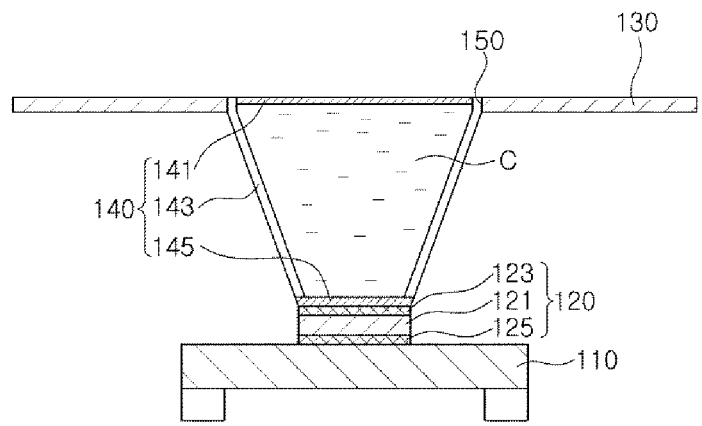
FIG. 3 is a cross-sectional view of a piezoelectric energy harvester according to an example.
Figure 4:
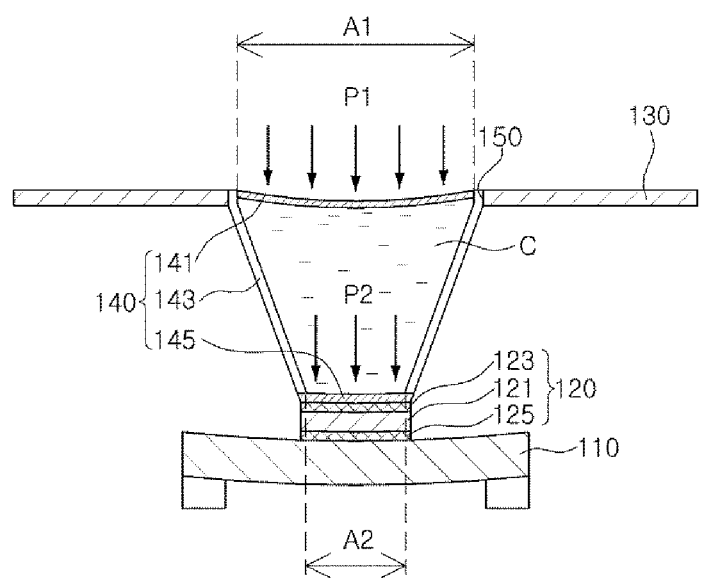
FIG. 4 is a cross-sectional view illustrating a manner in which the piezoelectric energy harvester according to an example is operated.

For example, the ON and OFF buttons are each a first elastic member 141 among components of the piezoelectric energy harvester 100, as shown in FIGS. 3-4.

The piezoelectric energy harvester 100 provides an amount of driving energy required for operating the wireless switch. Here, the piezoelectric energy harvester 100 provides power required for operating the transmitting module 500.

Power generated in the piezoelectric energy harvester 100 passes through the rectifier 200 and then is stored in the capacitor 300.

For example, the power supplied from the capacitor 300 is converted into power having a preset voltage level through the power controller 400 and is then transmitted to the transmitting module 500.

The transmitting module 500 generates communications signals using the power received from the power controller 400. The communications signals are transmitted to a receiving module of an external electronic device.

That is, the wireless switch according to an example uses energy generated using the piezoelectric energy harvester 100 as a source of the driving power of the transmitting module 500, thereby transmitting turn-on/off signals to the external lighting device using energy derived from using the piezoelectric energy harvester to convert a mechanical force into electrical energy.

Therefore, a wireless control system is simply built, without using mechanically complicated components, in order to connect a switch to a lighting device, or the like, in a home.

In addition, since the wireless switch is easily disposed in a place in which the connection of power lines is difficult or complicated, the wireless control system is more easily built than alternatives.

In addition, the wireless switch, according to an example, transmits signals for turning the lighting device on or off without including a separate battery embedded therein.

Next, a configuration of the piezoelectric energy harvester 100 according to an example for generating the energy used as the driving power of the transmitting module 500 will be described with reference to FIGS. 3 and 4.

FIG. 3 is a cross-sectional view of a piezoelectric energy harvester according to an example and FIG. 4 is a cross-sectional view illustrating a manner in which the piezoelectric energy harvester according to an example is operated.

First, referring to the example of FIG. 3, the piezoelectric energy harvester 100 according to an example includes a plate 110, a piezoelectric element 120 disposed on the plate 110, a pressing plate 130 disposed to be spaced apart from the piezoelectric element 120, and a pressure transmission part 140 disposed between the pressing plate 130 and the piezoelectric element 120.

In the example of FIG. 3, the plate 110 is formed of a material that is able to be elastically deformed.

In this example, the piezoelectric element 120 is disposed on one surface of the plate 110. The piezoelectric element 120 includes a piezoelectric body 121, a first electrode 123 disposed on one surface of the piezoelectric body 121, and a second electrode 125 disposed on the other surface of the piezoelectric body 121.

In addition, in some examples, the plate 110 is supported by support parts.

For example, the support parts are disposed at both distal ends of the plate 110, respectively, to support the plate 110.

Therefore, the plate 110 is elastically deformed together with the piezoelectric element 120 in a state in which the plate 110 is supported by the support parts.

The pressing plate 130 is disposed to be spaced apart from the piezoelectric element 120 and have a through-hole 150 that is formed in the pressing plate 130 to penetrate through the pressing plate 130. Also, the pressure transmission part 140 is inserted into the through-hole 150.

For example, one side of the pressure transmission part 140 is inserted into the through-hole 150 and the other side of the pressure transmission part 140 is disposed to contact one surface of the piezoelectric element 120.

The pressure transmission part 140 includes a body 143 having upper and lower portions that are opened and including an internal space, a first elastic member 141 enclosing the upper portion of the body 143, and a second elastic member 145 enclosing the lower portion of the body 143.

One side of the body 143 is inserted into the through-hole 150 and the other side of the body 143 is disposed to contact one surface of the piezoelectric element 120.

Here, in an example, areas of the upper and lower portions of the body 143 are different from each other.

In one example, the body 143 has a conical shape in which areas of the upper and lower portions thereof are different from each other. However, a shape of the body 143 is not limited to the conical shape. That is, a shape of the body 143 is not limited to a particular shape as long as areas of the upper and lower portions of the body 143 are different from each other. Thus, the body may have any one of a variety of particular shapes.

In addition, in some examples, an area of the upper portion of the body 143 is larger than that of the lower portion of the body 143.

The first elastic member 141 is disposed on the upper portion of the body 143 and encloses the upper portion of the body 143.

In addition, the second elastic member 145 is disposed on the lower portion of the body 143 and encloses the lower portion of the body 143.

Therefore, the internal space of the body 143 is enclosed by the first and second elastic members 141 and 145.

For example, the internal space of the body 143 enclosed by the first and second elastic members 141 and 145 is filled with a fluid C.

Various appropriate fluids are used in examples as fluid C. Here, furthermore, the fluid C disposed in the internal space of the body 143 in some examples is chosen to be an incompressible fluid.

In a case in which pressure is applied to the first elastic member 141, the fluid C serves to transmit the pressure applied to the first elastic member 141 to the second elastic member 145. The role of the fluid C in transmitting the applied pressure is aided when the fluid C is chosen to be an incompressible fluid.

For example, when the pressure, for example, pressure caused by the user pressing the first elastic member 141, is applied to the first elastic member 141, the first elastic member 141 is displaced in a direction in which the pressure is applied to the first elastic member 141, and the pressure is transmitted to the second elastic member 145 through the fluid C.

Therefore, pressure is also applied to one surface of the piezoelectric element 120 contacting the second elastic member 145 through the second elastic member 145, such that a displacement is generated in the piezoelectric element 120.

Here, in a case in which the pressure is not applied to the first elastic member 141, displacement is not generated in the piezoelectric element 120.

Therefore, the second elastic member 145 is not displaced toward the piezoelectric element 120 by the weights of the second elastic member 145 and the fluid C.

Meanwhile, unlike that described above, the body 143 is not filled with the fluid, but is instead filled with a solid.

In this case, the solid exerts an elastic force to transmit the pressure applied to the first elastic member 141 to the second elastic member 145.

When the displacement is generated in the piezoelectric element 120, a piezoelectric effect resulting from a potential difference occurs.

For example, when the user presses the first elastic member 141 disposed in the pressing plate 130, the displacement is generated in the first elastic member 141.

When the displacement is generated in the first elastic member 141, a volume of the fluid C disposed in the internal space of the body 143 is changed, such that pressure is also applied to the second elastic member 145.

In addition, since the second elastic member 145 contacts one surface of the piezoelectric element 120, the pressure applied to the second elastic member 145 is also transmitted to the piezoelectric element 120.

In addition, when the pressure is applied to the piezoelectric element 120 through the second elastic member 145, the displacement is generated in the piezoelectric element 120.

When the displacement is generated in the piezoelectric element 120, electrical polarization is generated in the piezoelectric element 120.

Therefore, a voltage is generated in the first electrode 123 and the second electrode 125 respectively provided on one surface and the other surface of the piezoelectric body 121, and an output current generated through the voltage is used as the driving power of the transmitting module 500.

In examples, the piezoelectric body 121 is formed of lead zirconate titanate, barium titanate ($BaTiO_3$), lead titanate ($PbTiO_3$), lithium niobate ($LiNbO_3$), silicon dioxide ($SiO_2$), or the like. These materials are example materials that have a piezoelectric response and hence are able to appropriately generate energy so that the voltage is generated as discussed above. However, these are only examples of candidate materials for the piezoelectric body 121, and other appropriate materials are also used in other examples.

The second electrode 125 is provided in order to generate a potential difference, and is disposed on the other surface of the piezoelectric body 121 in order to correspond to the first electrode 123.

Meanwhile, in a case in which force acts on the first elastic member 141, the force is uniformly transmitted to the piezoelectric element 120 by the pressure transmission part 140.

As illustrated in FIG. 4, when an amount of pressure applied to the first elastic member 141 is P1, an area of the first elastic member 141 is A1, an amount of pressure applied to the second elastic member 145 is P2, and an area of the second elastic member 145 is A2, the amount of pressure applied to the second elastic member 145 is calculated by the following Equation 1, below:

$$P2 = P1 \times \left(\frac{A1}{A2}\right)^n \qquad \text{Equation 1}$$

Here, $1 \leq n \leq 2$.

Therefore, when the area A1 of the first elastic member 141 is larger than the area A2 of the second elastic member 145, the amount of pressure P2 applied to the second elastic member 145 is greater than the amount of pressure P1 applied to the first elastic member 141, in accordance with Equation 1.

That is, P2>P1 may be satisfied.

When the amount of pressure P2, which is greater than the amount of pressure P1 applied to the first elastic member 141, is applied to the second elastic member 145, since the second elastic member 145 and one surface of the piezoelectric element 120 contact each other, the amount of pressure P2 applied to the second elastic member 145 is also applied to the piezoelectric element 120.

Therefore, the amount of pressure P2 greater than the amount of pressure P1 applied to the first elastic member 141 is applied to the piezoelectric element 120.

That is, when the user presses the first elastic member 141, even though the relatively small amount of pressure P1 is applied to the first elastic member 141, the relatively large amount of pressure P2 is transmitted to the piezoelectric element 120.

Therefore, when the user presses the first elastic member 141, even though the relatively small amount of pressure P1 is applied to the first elastic member 141, a displacement amount of the piezoelectric element 120 is increased. As a result, an amount of power generated in the piezoelectric energy harvester 100 according to an example is increased.

Meanwhile, a uniform amount of pressure is transmitted to a portion of the piezoelectric element 120 contacting the second elastic member 145 on one surface of the piezoelectric element 120.

Since the pressure applied to the first elastic member 141 is transmitted to the second elastic member 145 by the fluid C disposed in the internal space of the body 143, the uniform amount of pressure is transmitted to the portion of the piezoelectric element 120 in contact with the second elastic member 145 on one surface of the piezoelectric element 120.

Here, in a case in which the entirety of one surface of the piezoelectric element 120 contacts the second elastic member 145, the uniform amount of pressure P2 is transmitted to the entirety of one surface of the piezoelectric element 120.

The uniform amount of pressure is transmitted to the entirety of one surface of the piezoelectric element 120 in contact with the second elastic member 145 by the fluid C disposed in the internal space of the body 143.

As described above, the pressure is transmitted to the piezoelectric element 120 through the pressure transmission part 140, and the power generated by the displacement of the piezoelectric element 120 is transmitted to the transmitting module 500 and is used for the driving power of the transmitting module 500.

Therefore, the wireless switch according to an example transmits the communications signals to the external electronic device without including a separate battery embedded in the wireless switch, because the power generated using the piezoelectric effect is sufficient to allow the communication without the need for such a separate battery.

As set forth above, the piezoelectric energy harvester according to an exemplary embodiment in the present disclosure provides driving power to the transmitting module included in the wireless switch. Therefore, the wireless switch including the piezoelectric energy harvester according to an example transmits signals for turning the lighting device on or off without including a separate battery embedded therein.

In addition, in the piezoelectric energy harvester and the wireless switch including the same according to an example, a uniform amount of pressure is transmitted to the piezoelectric element.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A piezoelectric energy harvester comprising:
   a plate;
   a piezoelectric element disposed on one surface of the plate;
   a pressing plate disposed so as to be spaced apart from the piezoelectric element; and
   a pressure transmission element disposed directly between the pressing plate and the piezoelectric element, and comprising a body,
   wherein an area of an upper surface of the body is larger than an area of a lower surface of the body.

2. The piezoelectric energy harvester of claim 1, wherein the pressing plate has a through-hole penetrating through the pressing plate, one end of the pressure transmission element is inserted into the through-hole, and the other end of the pressure transmission element is situated to be in contact with the piezoelectric element.

3. The piezoelectric energy harvester of claim 1, wherein the pressure transmission element further comprises:

an internal space defined between the upper surface and the lower surface of the body, wherein the upper surface and the lower surface are open;

a first elastic member enclosing the upper surface of the body; and a second elastic member enclosing the lower surface of the body.

4. The piezoelectric energy harvester of claim 3, wherein the internal space of the body is filled with a fluid.

5. The piezoelectric energy harvester of claim 4, wherein the fluid is an incompressible fluid.

6. The piezoelectric energy harvester of claim 3, wherein the internal space of the body is filled with a solid that conveys elastic force.

7. The piezoelectric energy harvester of claim 3, wherein the first elastic member is inserted into a through-hole penetrating through the pressing plate, and the second elastic member is in contact with the piezoelectric element.

8. The piezoelectric energy harvester of claim 7, wherein the first elastic member and the second elastic member have different areas.

9. The piezoelectric energy harvester of claim 7, wherein an area of the first elastic member is larger than that of the second elastic member.

10. The piezoelectric energy harvester of claim 7, wherein in response to a force being applied to the first elastic member, an amount of pressure acting on the first elastic member is smaller than an amount of pressure acting on the second elastic member.

11. The piezoelectric energy harvester of claim 1, wherein the body has a conical shape.

12. A wireless switch comprising:

a piezoelectric energy harvester comprising a plate, a piezoelectric element disposed on one surface of the plate, a pressing plate disposed so as to be spaced apart from the piezoelectric element, and a pressure transmission element disposed directly between the pressing plate and the piezoelectric element, and comprising a body, wherein an area of an upper surface the body is larger than an area of a lower surface of the body; and a transmitting module configured to transmit electrical signals using power generated by the piezoelectric energy harvester as driving power.

13. The wireless switch of claim 12, wherein the pressing plate has a through-hole penetrating through the pressing plate, one end of the pressure transmission element is inserted into the through-hole, and the other end of the pressure transmission element is situated to be in contact with the piezoelectric element.

14. The wireless switch of claim 12, wherein the pressure transmission element further comprises:

an internal space defined between the upper surface and the lower surface of the body, wherein the upper surface and the lower surface are open;

a first elastic member enclosing the upper surface of the body; and a second elastic member enclosing the lower surface of the body.

15. A piezoelectric energy harvester, comprising:

a piezoelectric element disposed on a surface of a plate;

a pressing plate spaced apart from the piezoelectric element; and a pressure transmission element disposed between the pressing plate and the piezoelectric element, and comprising a first elastic member spaced apart from a second elastic member, wherein the first elastic member is disposed on an upper surface of the pressure transmission element and the second elastic member disposed on a lower surface of the pressure transmission element, and wherein an area of the upper surface is larger than an area of the lower surface.

16. The piezoelectric energy harvester of claim 15, wherein a volume defined by the first elastic member being spaced apart from the second elastic member is conical in shape.

17. The piezoelectric energy harvester of claim 16, wherein the first elastic member is inserted into a through-hole penetrating through the pressing plate, and the second elastic member abuts the piezoelectric element.

18. The piezoelectric energy harvester of claim 16, wherein the volume is filled with a fluid.

* * * * *